United States Patent
Goldbach

(10) Patent No.: US 9,985,178 B2
(45) Date of Patent: May 29, 2018

(54) SEMICONDUCTOR CHIP AND METHOD OF SEPARATING A COMPOSITE INTO SEMICONDUCTOR CHIPS

(71) Applicant: OSRAM Opto Semiconductors GmbH, Regensburg (DE)

(72) Inventor: Matthias Goldbach, Pentling (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days. days.

(21) Appl. No.: 15/027,971

(22) PCT Filed: Oct. 6, 2014

(86) PCT No.: PCT/EP2014/071291
§ 371 (c)(1),
(2) Date: Apr. 7, 2016

(87) PCT Pub. No.: WO2015/052108
PCT Pub. Date: Apr. 16, 2015

(65) Prior Publication Data
US 2016/0240736 A1    Aug. 18, 2016

(30) Foreign Application Priority Data
Oct. 8, 2013   (DE) .................. 10 2013 111 120

(51) Int. Cl.
*H01L 33/20*   (2010.01)
*H01L 33/00*   (2010.01)
*H01L 33/16*   (2010.01)
*H01L 33/30*   (2010.01)
*H01L 33/38*   (2010.01)

(52) U.S. Cl.
CPC .......... *H01L 33/20* (2013.01); *H01L 33/0066* (2013.01); *H01L 33/0095* (2013.01); *H01L 33/16* (2013.01); *H01L 33/30* (2013.01); *H01L 33/38* (2013.01); *H01L 33/385* (2013.01)

(58) Field of Classification Search
CPC .......... H01L 33/20; H01L 33/38; H01L 33/16
See application file for complete search history.

(56) References Cited

U.S. PATENT DOCUMENTS

| | | | |
|---|---|---|---|
| 6,307,218 B1 | 10/2001 | Steigerwald et al. | |
| 2003/0178627 A1* | 9/2003 | Marchl | H01L 25/0753 257/80 |
| 2005/0151147 A1 | 7/2005 | Izuno et al. | |

(Continued)

FOREIGN PATENT DOCUMENTS

| | | |
|---|---|---|
| DE | 102008005497 A1 | 7/2009 |
| WO | 201002007 A1 | 2/2010 |

*Primary Examiner* — Phat X Cao
(74) *Attorney, Agent, or Firm* — McDermott Will & Emery LLP

(57) ABSTRACT

The invention concerns a semiconductor chip (100) with a semiconductor body (2) having a semiconductor layer sequence, and with a substrate body (4) and at least one upper side contact (8). In projection the semiconductor chip (100) has a shape which deviates from a rectangular shape. The invention also concerns a method of separating a composite into a plurality of semiconductor chips (100) along a separation pattern (15) with the steps enabling a plurality of semiconductor chips according to the invention to be produced.

8 Claims, 7 Drawing Sheets

(56) References Cited

U.S. PATENT DOCUMENTS

2007/0001180 A1\* 1/2007 Obara ................... H01L 33/62
                                                        257/98
2007/0176193 A1  8/2007 Nagai
2009/0008654 A1  1/2009 Nagai \* cited by examiner

SEMICONDUCTOR CHIP AND METHOD OF SEPARATING A COMPOSITE INTO SEMICONDUCTOR CHIPS

SUMMARY

The present application relates to a semiconductor chip and to a method of separating a composite into a plurality of semiconductor chips.

This patent application claims the priority of German patent application 102013111120.3, the disclosure content of which is hereby incorporated by reference.

Semiconductor chips usually comprise a semiconductor body, which is arranged on a carrier and which often has to be cut out laterally in order to provide a contact accessible from a top side of the semiconductor chip. As a result, the area of the semiconductor body, and thus in many applications also the functional area of the semiconductor chip, deviates from a desired square or rectangular shape in a plan view of the semiconductor chip.

By way of example, the prior art discloses square or rectangular light-emitting diode chips in which provision is made of at least one top side contact in the form of a bonding pad which is arranged in a manner laterally offset from the electromagnetic radiation-generating semiconductor body. As a result, the functional area (in this case the radiation exit area or luminous area) of the respective light-emitting diode chip is restricted in a partial region, such that it deviates from a desired square or rectangular shape. This geometrical deviation is also found in the conversion element possibly arranged on the semiconductor body.

The prior art discloses rectangular semiconductor chips having a semiconductor body embodied in a square fashion, in which semiconductor chips a strip for contacting the semiconductor body is provided in a laterally offset fashion. In this case, the strip must have certain minimum dimensions required for contacting by a bonding wire. The fact that the bonding wire only requires a contacting area embodied in a substantially square fashion means that a not inconsiderable part of the elongate strip is left unused.

One object is to specify a semiconductor chip which, when a surface contact is provided, experiences no undesired restriction with regard to the shape of the semiconductor body and/or its functional area, in particular its radiation exit area in the case of an electromagnetic radiation-emitting semiconductor chip. Furthermore, the intention is to specify a simple and reliable separating method for producing such semiconductor chips.

A further object is, in particular, to specify a semiconductor chip which, with identical design, can be provided in large numbers by means of a simple separating method, without valuable area of the composite that is used being wasted in the separating method. The identical design of the semiconductor chips prevents an increased logistical complexity.

These objects are achieved, inter alia, by means of a semiconductor chip and a method according to the independent patent claims. The dependent patent claims relate to configurations and expediencies.

In accordance with at least one embodiment, a semiconductor chip has a semiconductor body, which comprises a semiconductor layer sequence, and a carrier body, which are arranged one on top of another in a vertical direction. The semiconductor chip has in projection a shape that deviates from a rectangular shape. In particular, the semiconductor chip can have in projection the shape of a polygon having more than four vertices. Furthermore, the semiconductor chip has at least one top side contact which is provided for externally contacting at least one part of the semiconductor body (for example one of the semiconductor layers) and is freely accessible from a top side of the semiconductor chip.

Here and hereinafter, the top side of the semiconductor chip is understood to mean that side of the semiconductor chip which faces away from the carrier body as seen from the semiconductor body. Analogously, the rear side of the semiconductor chip is understood to mean that side of the semiconductor chip on which the carrier body is arranged as seen from the semiconductor body.

Similarly, here and hereinafter, projection is understood to mean a vertical projection, that is to say a projection of an element (preferably from a top side of the semiconductor chip) along a vertical direction, i.e. along a direction perpendicular to the main extension plane of the semiconductor layers of the semiconductor layer sequence.

By virtue of the fact that the semiconductor chip does not have a rectangular shape in projection, the semiconductor body can be embodied in a rectangular fashion, and in particular in a square fashion, while enough space for the positioning of a top side contact spaced apart laterally from the semiconductor body is nevertheless present at the same time on the top side of the semiconductor chip. As a result, a functional area of the semiconductor chip, in particular a radiation exit area, can also be embodied in a rectangular fashion, and in particular in a square fashion.

The semiconductor chip can generally be embodied as an integrated circuit. Preferably, the semiconductor chip is embodied as an optoelectronic component, for example a semiconductor solar cell, a light-emitting diode chip or a laser diode chip. If the semiconductor chip is embodied as a radiation-emitting component, as for example in the two last-mentioned cases, then the radiation exit area of the semiconductor chip can be embodied in a rectangular fashion, and in particular in a square fashion.

In accordance with at least one embodiment of the semiconductor chip, it is provided that the semiconductor chip has a base region and a contact region, which is offset laterally from the base region, wherein the at least one top side contact is arranged at least partly, preferably completely, in the contact region. In this case, a lateral direction is understood to mean a direction which runs along a main extension plane of the semiconductor layers of the semiconductor layer sequence.

In accordance with at least one embodiment of the semiconductor chip, it is provided that the semiconductor body is arranged only in the base region. Preferably, the base region is embodied in a rectangular fashion, and in particular in a square fashion, in projection. Preference is given to an embodiment in which a semiconductor body embodied in a rectangular fashion in projection is arranged in the base region of the semiconductor chip, said base region being embodied in a rectangular fashion in projection, and is at least partly electrically connected to the top side contact that is offset laterally from the semiconductor body and is arranged exclusively in the contact region.

In accordance with at least one embodiment of the semiconductor chip, it is provided that only a single top side contact is arranged in the contact region. This usually presupposes that a rear side contact for the further contacting of the semiconductor body is furthermore present, which typically requires a conductive carrier body.

In accordance with at least one embodiment of the semiconductor chip, it is provided that two top side contacts are arranged in the contact region. By way of example, each of the two top side contacts can be electrically connected to a respective semiconductor layer. In this embodiment, the carrier body can be embodied in an insulating fashion.

In accordance with at least one embodiment of the semiconductor chip, it is provided that the base region has in projection the shape of a rectangle, wherein a first side of the rectangle extends along a first vertical direction and a second side of the rectangle extends along a second vertical direction, running perpendicular to the first direction. The contact region is adjacent to a side surface of the base region. Consequently, the contact region in projection is adjacent to a side of the rectangle of the projected base region, here the first side.

Here and hereinafter, the "width" of an element is understood to mean a dimension along the first vertical direction and the "height" of an element is understood to mean a dimension along the second vertical direction.

Here and hereinafter, a "reference rectangle" is understood to mean a rectangle, one side of which is formed by a side of the projected base region, in particular by the first side of the rectangle of the base region, and the height of which is equal to the maximum height of the projected contact region. If the base region is embodied in a rectangular fashion, then the reference rectangle thus has the same width as the projected base region. Hereinafter, said width is designated by B.

In accordance with at least one embodiment of the semiconductor chip, it is provided that the contact region is arranged in projection completely within the reference rectangle. In this case, the contact region runs within a strip that is predefined by the width of the base region.

In accordance with at least one embodiment of the semiconductor chip, it is provided that the area of the contact region in projection is less than the area of the reference rectangle. This gives rise to a saving of area in comparison with the above-described rectangular semiconductor chip known from the prior art and having a laterally offset contact strip, since the latter coincides in projection with the reference rectangle defined here.

In accordance with at least one embodiment of the semiconductor chip, it is provided that the area of the contact region in projection is less than 75% of the area of the reference rectangle. This gives rise to a further saving of area in comparison with the prior art.

In accordance with at least one embodiment of the semiconductor chip, it is provided that the area of the contact region in projection is less than 50% of the area of the reference rectangle. This gives rise to a further saving of area in comparison with the prior art.

In accordance with at least one embodiment of the semiconductor chip, it is provided that the contact region is arranged in projection completely or at least with more than 80% (preferably more than 90%) of its area within a reference trapezoid arranged in the reference rectangle. In this case, the height of the reference trapezoid is equal to that of the reference rectangle. Moreover, the reference trapezoid is arranged outside the point of intersection of the diagonals of the reference rectangle, i.e. the point of intersection of the diagonals of the reference rectangle lies outside the reference trapezoid.

Preferably, more than 40% (preferably more than 45%) of the area of the reference rectangle is not covered by the contact region, i.e. is free of material of the contact region and in particular free of material of the semiconductor chip.

As a result, an inverted (second) reference trapezoid exists, which emerges from the (first) reference trapezoid by means of point mirroring at the point of intersection of the diagonals of the reference rectangle, which is likewise arranged within the reference rectangle and which does not overlap the projected (first) contact region. This free region can be used for a (second) contact region—which is of identical type and is rotated by 180°—of a further semiconductor chip. This geometry therefore makes it possible that two semiconductor chips which are of identical type and rotated by 180° relative to one another can be arranged in relation to one another without or at least only with little loss of area, wherein the contact regions of the two semiconductor chips are arranged directly adjacently with respect to one another.

Preferably, the entire area or at least more than 80% (preferably more than 90%) of the area of the inverted (second) reference trapezoid is not covered by the contact region, i.e. is free of material of the contact region and in particular free of material of the semiconductor chip.

A multiplicity of such semiconductor chips can be produced by an advantageous separating method in which a contact strip embodied in a rectangular fashion is divided into two mutually adjacent regions by suitable separation along a separation pattern which is point-symmetrical with regard to the point of intersection of the diagonals of the contact strip, which mutually adjacent regions correspond to the two contact regions of two semiconductor chips which are of identical type and which are rotated by 180° relative to one another.

In accordance with at least one embodiment of the semiconductor chip, it is provided that a width of the contact region in projection increases in a direction toward the base region. This enables current spreading at the contacting of the semiconductor body.

Hereinafter the reference rectangle is imagined to be divided into four rectangular subdivisions of identical type, each having a width B/4 (that is to say one quarter of the width of the projected base region) and the same height as the reference rectangle.

In accordance with at least one embodiment of the semiconductor chip, it is provided that the contact region is arranged in projection completely or at least with more than 80% (preferably more than 90%) of its area within one of the two central (that is to say the second or third) rectangular subdivisions of the reference rectangle. As a result, the three other subdivisions of the reference rectangle are (at least predominantly) free of the contact region, i.e. said subdivisions do not overlap or only very slightly overlap the projected (first) contact region of the semiconductor chip.

These free regions can be used for further contact regions of identical type of three further semiconductor chips. This geometry therefore makes it possible that four semiconductor chips which are of identical type and are rotated by 90° relative to one another can be arranged in relation to one another without or at least only with little loss of area, wherein the contact regions of the four semiconductor chips are arranged directly adjacently with respect to one another.

A multiplicity of such semiconductor chips can be produced by an advantageous separating method in which a contact strip embodied in a rectangular fashion is divided into four mutually adjacent regions by suitable separation, which mutually adjacent regions correspond to the respective contact regions of four semiconductor chips which are of identical type and which are rotated by 90° relative to one another.

In accordance with at least one embodiment of the semiconductor chip, it is provided that the contact region has in projection a width $B/4-3t/4$ and a height $B/4+t/4$, wherein t is a (constant) distance. In this case, deviations of the stated dimensions of up to 20%, preferably only up to 10%, can occur, without unduly restricting the desired effect. Preferably, the contact region in projection is shaped in a substantially rectangular fashion, wherein the rectangle formed has the dimensions mentioned. The latter correspond to an area-optimized solution for separation with a separation pattern having a constant separation diameter t. The stated deviations of up to 20% are attributable, in particular, to the fact that a constant diameter of the separation pattern can never be reproduced at every point of the area and roundings occur at the corners of the separation pattern depending on the method used, for example when a laser separation method is used.

In accordance with at least one embodiment of the semiconductor chip, it is provided that a crystal which forms the carrier body is oriented in such a way that a plurality or all of the side surfaces of the carrier body (in particular side surfaces of the carrier body in the contact region) are formed by crystal faces which have a low risk of fracture, in particular a lower risk of fracture than other crystal faces.

By way of example, the carrier body can consist of silicon or germanium which preferably breaks along a {100} plane (corresponding to the equivalent planes (100), (010) or (001)). In this case, it is provided that a plurality or all of the side surfaces of the carrier body (in particular side surfaces of the carrier body in the contact region) run parallel to the {110} planes of the crystal forming it (corresponding to the equivalent planes (110), (011) or (101)) or are formed by {110} planes of the crystal forming it. Preferably, in this case a plurality or all of the side surfaces of the entire semiconductor chip run parallel to the {110} planes (corresponding to the equivalent planes (110), (011) or (101)) of the crystal forming the carrier body.

In accordance with at least one embodiment of the semiconductor chip, it is provided that the semiconductor chip is embodied as a thin-film semiconductor chip in which a growth substrate for the semiconductor layer sequence of the semiconductor body is removed and the carrier body mechanically stabilizes the semiconductor body.

Furthermore, a method of separating a composite into a plurality of semiconductor chips is specified.

In accordance with at least one embodiment of the method, a composite is provided. The composite extends in a vertical direction between a first main surface and a second main surface. Separation is carried out in particular along a separation pattern. By way of example, the separation pattern can be embodied in a lattice-shaped fashion. However, the separation need not necessarily be carried out along separation lines running straight.

In accordance with at least one embodiment of the method, the composite comprises a carrier. The carrier contains for example a semiconductor material, for instance silicon, germanium, gallium phosphide or gallium arsenide, or consists of such a material. The carrier can be embodied as electrically conductive or electrically insulating.

In accordance with at least one embodiment of the method, the composite comprises a semiconductor layer sequence. The semiconductor layer sequence is deposited for example epitaxially, for instance by means of MOCVD or MBE. The semiconductor layer sequence can be deposited on the carrier or on a growth substrate that is different than the carrier. By way of example, the semiconductor layer sequence contains an active region provided for generating radiation and/or for receiving radiation.

By way of example, the semiconductor layer sequence, in particular the active region, contains a III-V compound semiconductor material. III-V compound semiconductor materials are particularly suitable for generating radiation in the ultraviolet ($Al_xIn_yGa_{1-x-y}$ N) through the visible ($Al_xIn_yGa_{1-x-y}$ N, in particular for blue to green radiation, or $Al_xIn_yGa_{1-x-y}$ P, in particular for yellow to red radiation) to the infrared ($Al_xIn_yGa_{1-x-y}$ As) spectral range. Here in each case $0 \leq x \leq 1$, $0 \leq y \leq 1$ and $x+y \leq 1$, hold true, in particular where $x \neq 1$, $y \neq 1$, and/or $y \neq 0$. With III-V compound semiconductor materials, in particular from the material systems mentioned, high internal quantum efficiencies can furthermore be obtained when generating radiation.

The first main surface is situated, in particular, on that side of the semiconductor layer sequence which faces away from the carrier. Correspondingly, the second main surface is situated, in particular, on that side of the carrier which faces away from the semiconductor layer sequence.

In accordance with at least one embodiment of the method, separating trenches are formed in the carrier, in particular along the separation pattern. In the separated semiconductor chips, the side surfaces of the separating trenches form, in particular, the side surfaces delimiting the semiconductor chip in a lateral direction.

In accordance with one embodiment variant, mesa trenches are already formed during the process of forming the separating trenches in the semiconductor layer sequence. The mesa trenches define the individual semiconductor bodies that emerge from the semiconductor layer sequence. By way of example, the mesa trenches extend completely through the semiconductor layer sequence. In other words, the semiconductor layer sequence is already severed during the process of forming the separating trenches. The separation pattern therefore runs along the mesa trenches in a plan view of the composite. Correspondingly, the separating trenches are formed along the mesa trenches.

The singulated semiconductor chips in each case comprise, in particular, a part of the semiconductor layer sequence and of the carrier.

In accordance with at least one embodiment of the method, it is provided that the composite is severed along the separation pattern by means of coherent radiation, in particular using a laser separation method. As a result of the material removal by means of coherent radiation, traces of material removal by coherent radiation arise regionally at the side surfaces of the semiconductor chips which arise during separation.

In accordance with at least one embodiment of the method, it is provided that the composite is severed by means of a chemical method along the separation pattern. In particular, the separation is carried out by means of a plasma separation method, for example by means of an ICP (inductively coupled plasma) method or by means of deep reactive ion etching (DRIE). This method is also referred to as the "Bosch process". Plasma separation methods can be distinguished by high etching rates particularly in semiconductor material.

In accordance with at least one embodiment of the method, the severing is carried out along a non-rectilinear course at least in a first vertical direction.

In accordance with at least one embodiment of the method, the severing is carried out along a non-rectilinear course in the first vertical direction and in a second vertical direction.

In accordance with at least one embodiment of the method, it is provided that the composite comprises a multiplicity of contact strips embodied in a rectangular fashion in projection, and that each of the contact strips is divided into at least two mutually adjacent regions by separation along the separation pattern, with the result that two semiconductor chips having the properties described above arise.

In accordance with at least one embodiment of the method, it is provided that the separation pattern is point-symmetrical with regard to the point of intersection of the diagonals of the contact strip.

In accordance with at least one embodiment of the method, it is provided that each of the contact strips is divided into four mutually adjacent regions by separation along the separation pattern, with the result that four semiconductor chips having the properties described above arise.

In accordance with at least one embodiment of the method, it is provided that the separation pattern is point-symmetrical with regard to the point of intersection of the diagonals of the contact strip.

In accordance with at least one embodiment of the method, it is provided that the separation lines corresponding to the separation pattern have a constant diameter.

The above-described method of separating a composite into semiconductor chips is particularly suitable for the production of the semiconductor chip. Features described in association with the method can therefore also be used for the semiconductor chip, and vice versa.

Further features, configurations and expediencies will become apparent from the following description of the exemplary embodiments in association with the figures.

DETAILED DESCRIPTION

Figure 1A:
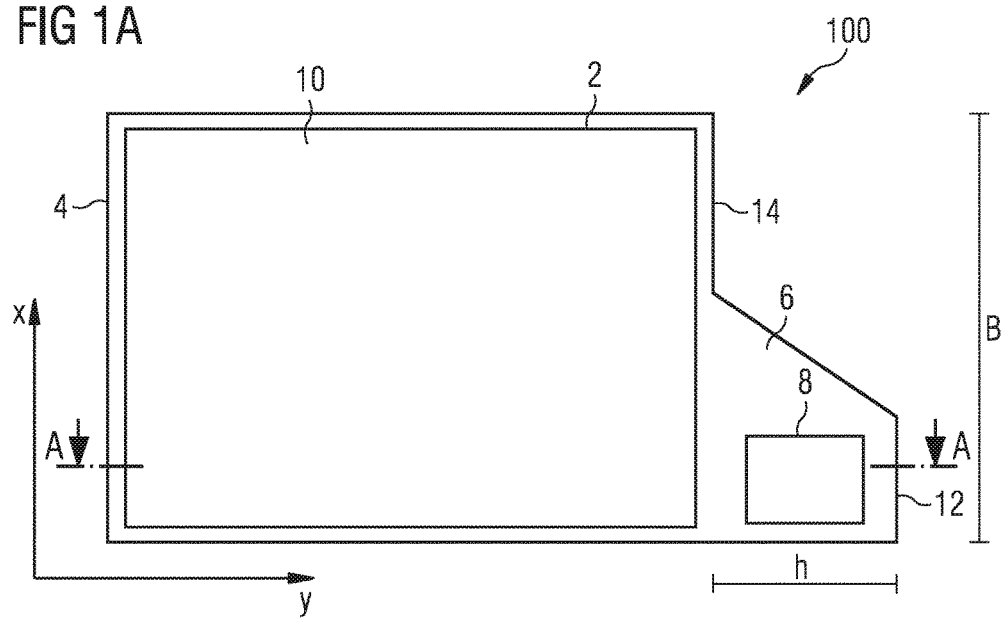
FIGS. 1 to 3 show a first exemplary embodiment of a semiconductor chip according to the invention.
Figure 1B:
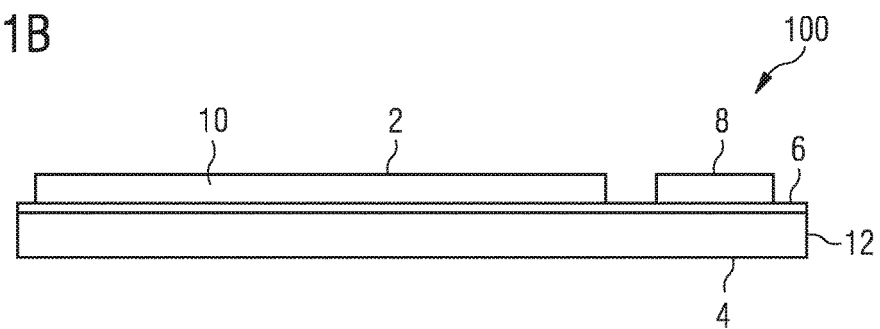

FIGS. 1A and 1B show a semiconductor chip in accordance with a first embodiment of the invention in plan view (FIG. 1A) and in a sectional illustration along the line A-A shown in FIG. 1A (FIG. 1B). The semiconductor chip, designated in its entirety by 100, comprises a semiconductor body 2, which is embodied in a rectangular fashion in projection and which is arranged on a carrier body 4. FIG. 1A shows a projection of the semiconductor chip 100 into an X-Y plane, from which it is evident that the semiconductor chip has in projection a shape that deviates from a rectangular shape. In the present case, the shape of the semiconductor chip corresponds to a polygon having six vertices. The carrier 4 stabilizes the semiconductor body 2 and has the same shape as the semiconductor chip 100 overall. A mirror layer 6 is arranged between the carrier body 4 and the semiconductor body 2, said mirror layer producing an electrically conductive connection between a semiconductor layer (not illustrated) of the semiconductor body 2 and a surface contact 8 in the form of a bonding pad. The semiconductor chip 100 has a base region 10, which is embodied in a rectangular fashion in projection and in which is arranged the semiconductor body 2, likewise embodied in a rectangular fashion.

Hereinafter, width denotes the dimension of an element along the X-direction and height denotes a dimension along the Y-direction. A contact region 12 is adjacent to a side surface 14 of the base region 10, the surface contact 8 being arranged on said contact region. In the present exemplary embodiment, the contact region 12 has in projection the shape of a right-angled trapezoid, the width of the contact region 12 increasing in the direction toward the base region 10.

A width of the rectangle forming the base region 10 is designated hereinafter by B, and a maximum height of the contact region 12 by h.

Figure 2:
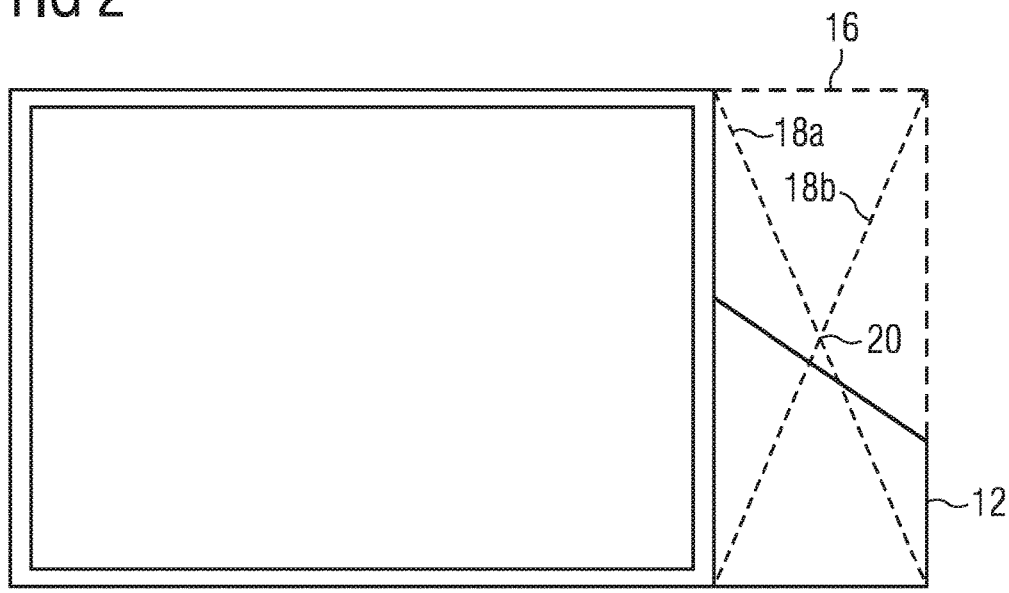

FIG. 2 illustrates a reference rectangle 16 which has a width B and a height h and in which the projected contact region 12 is arranged completely. In this case, an area of the projected contact region 12 is less than the area of the reference rectangle 16. FIG. 2 shows the two diagonals 18a, 18b of the reference rectangle 16, which form a point of intersection 20 of the diagonals. The point of intersection 20 of the diagonals is arranged outside the projected contact region 12.

Figure 3:
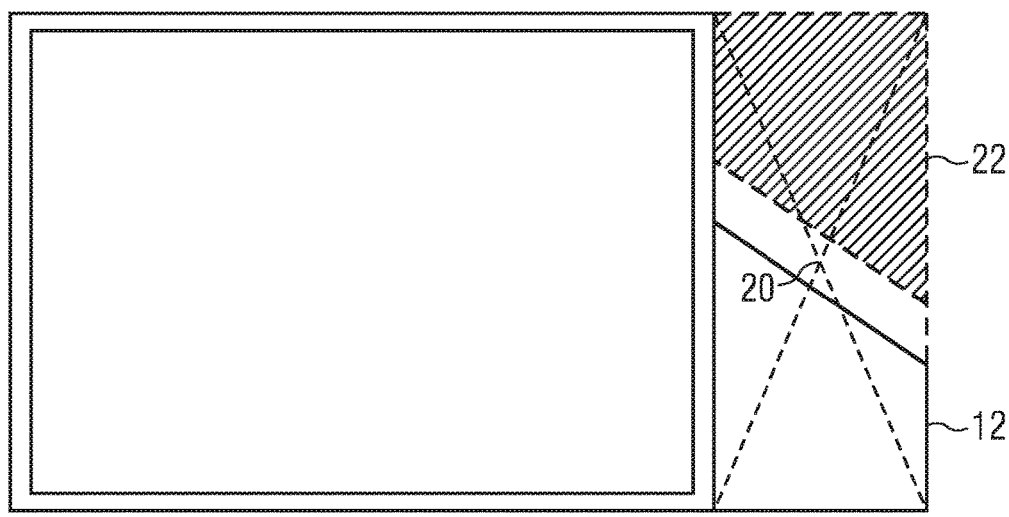

FIG. 3 shows an inverted trapezoid 22, which emerges from the trapezoid forming the contact region 12 by point mirroring at the point of intersection 20 of the diagonals. The area covered by the inverted trapezoid 22 can be used for a contact region—which is of identical type and which is rotated by 180°—of a further semiconductor chip (not illustrated), at least minus a separating line that separates the two semiconductor chips from one another. Consequently, two semiconductor chips which are of identical type and which are rotated by 180° relative to one another can be arranged opposite with only little loss of area relative to one another, as a result of which an area-saving separation method is made possible.

Figure 4:
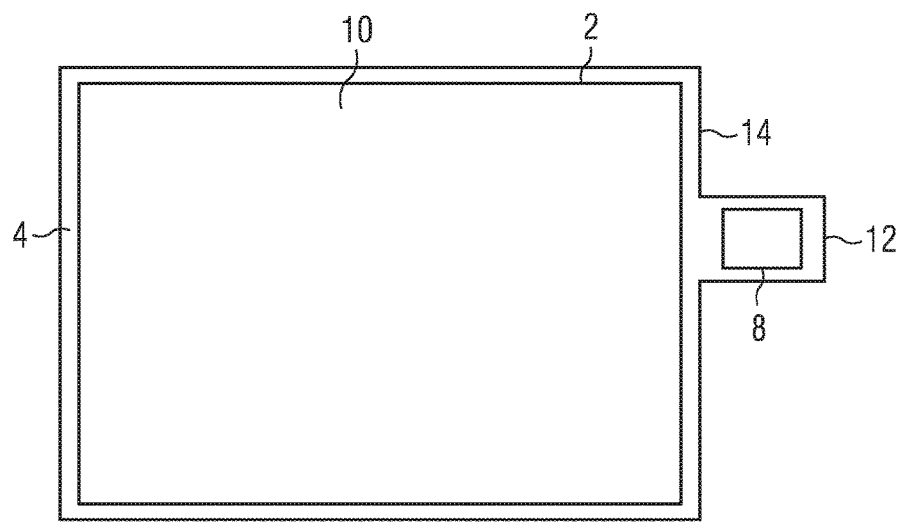
FIGS. 4 to 5 show a second exemplary embodiment of a semiconductor chip according to the invention.

FIG. 4 shows a semiconductor chip in accordance with a second exemplary embodiment of the invention. In contrast to the exemplary embodiment shown in FIGS. 1 to 3, the contact region 12, on which the surface contact 8 is arranged, occupies even less area. In this case, the contact region 12 in projection is shaped in a substantially rectangular fashion.

FIG. 5 again shows the reference rectangle 16 having a width B and a height h. Furthermore, four subdivisions 24a, 24b, 24c, 24d are shown, which are embodied in a rectangular fashion and each have a width B/4. The projected contact region 12 has a height h and a width B that is less than B/4. As a result, the contact region 12 is arranged in projection completely within one of the two central subdivisions 24b, 24c, in the subdivision 24c in the present example. The free regions in the other subdivisions 24a, 24b, 24d can be used for further contact regions of identical type of three further semiconductor chips (not illustrated). In the present example, the contact region 12 has in projection a width b=B/4−3t/4 and a height h=B/4+t/4, which corresponds to an area-optimized solution for separation with a separation pattern having a constant separation diameter t.

By way of example, the following dimensions result if the width B of the semiconductor chip 100 is 1000 µm and a diameter of the separation method t is 40 µm: the width B of the contact region 12 is 220 µm, and the height h of the contact region 12 is 260 µm. Such dimensions are suitable for the typically required dimensions of a surface contact (width and height around approximately 150 µm) which can accommodate a bonding wire having a thickness of approximately 40 µm.

Figure 6:
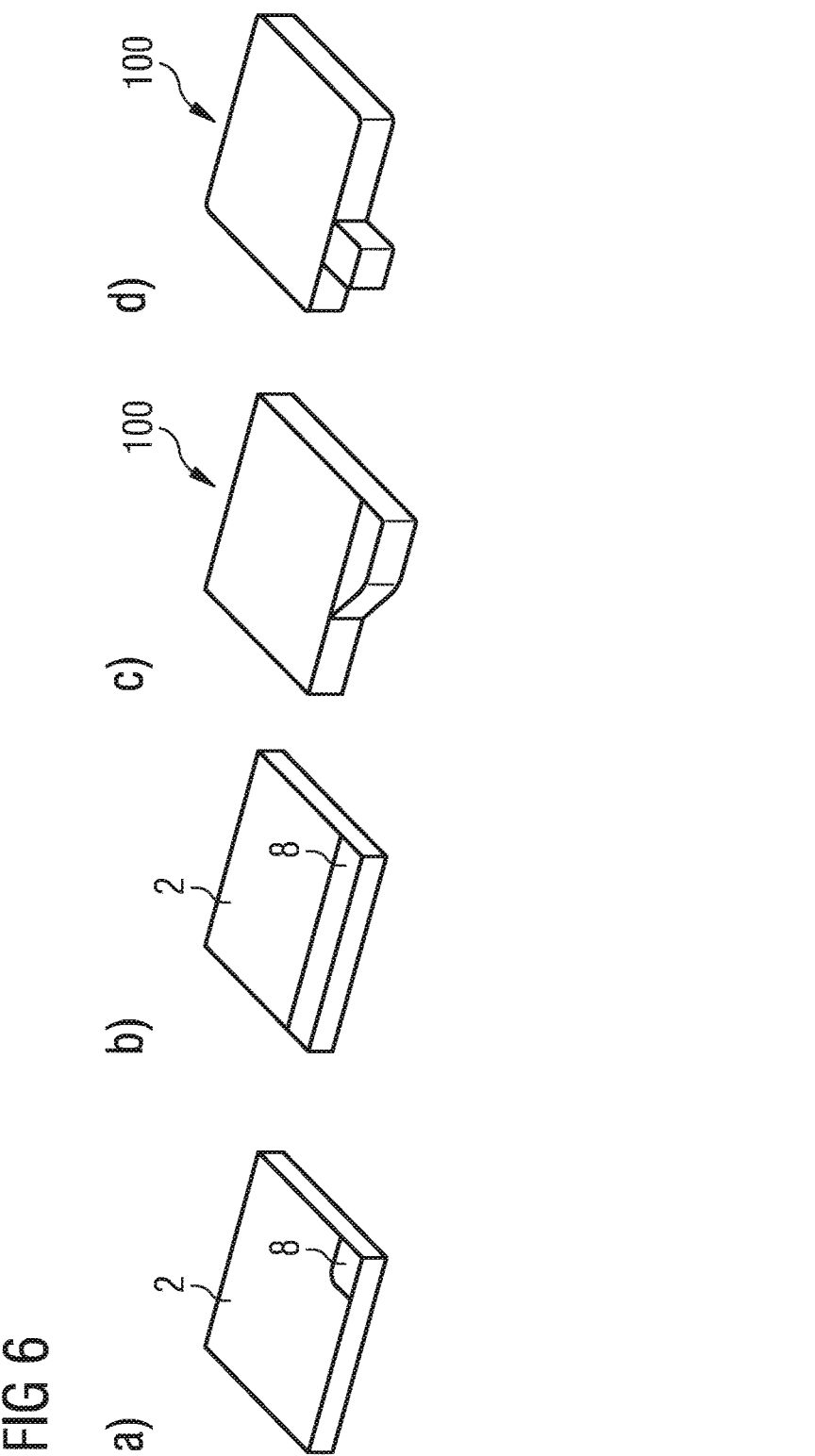
FIGS. 6A to D show in comparison semiconductor chips from the prior art and in accordance with the two embodiments shown in FIGS. 1 to 5.

FIGS. 6A, 6B, 6C, 6D show in comparison semiconductor chips from the prior art and in accordance with the two embodiments described above. FIG. 6A shows a semiconductor chip having a semiconductor body 2 which is cut out laterally in order to contact the semiconductor body 2 from the top side via a top side contact 8.

FIG. 6B shows a rectangular semiconductor chip known from the prior art and having a semiconductor body 2, embodied in a square fashion, and a laterally offset contacting strip 8, which has in projection the same area as the reference rectangle defined above. With typical dimensions, a relative increase in area of 16% arises in this case in comparison with the semiconductor chip shown in FIG. 6A. FIGS. 6C and 6D show semiconductor chips according to the invention in accordance with the two embodiments shown in FIGS. 1 to 5. In the case thereof, with the same typical dimensions, relative increases in area of only 7% (FIG. 6C) and 4% (FIG. 6D) result.

Figure 7:
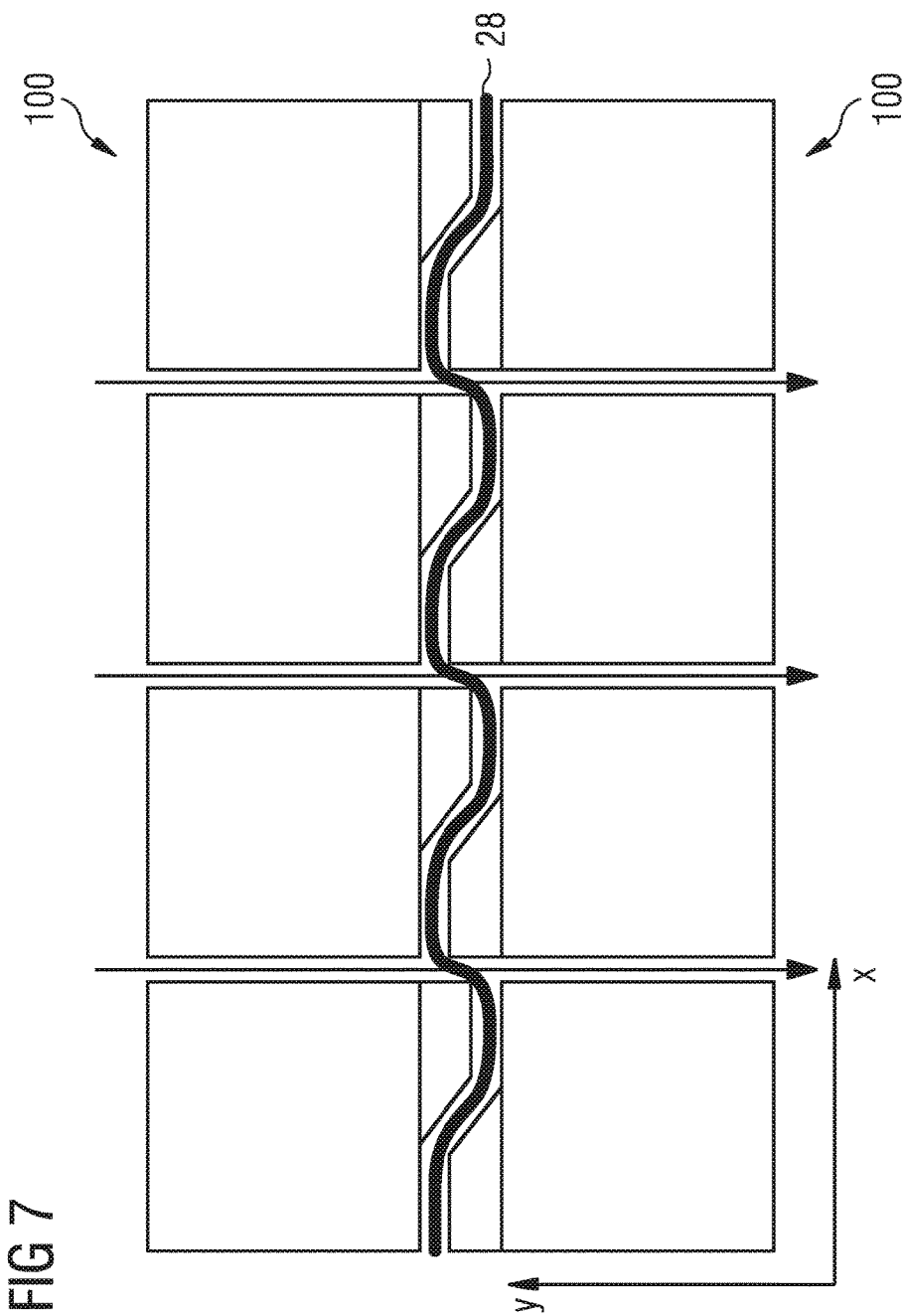
FIG. 7 shows one possible separation pattern which can be used to produce semiconductor chips in accordance with the first exemplary embodiment.

FIG. 7 shows one possible separation pattern which can be used to produce semiconductor chips in accordance with the first exemplary embodiment illustrated in FIGS. 1 to 3. Along the Y-direction, the separating lines corresponding to the separation pattern run rectilinearly (identified by the straight solid arrows), while said separating lines do not run rectilinearly along the X-direction (see the non-rectilinear separating line 28).

Figure 5:
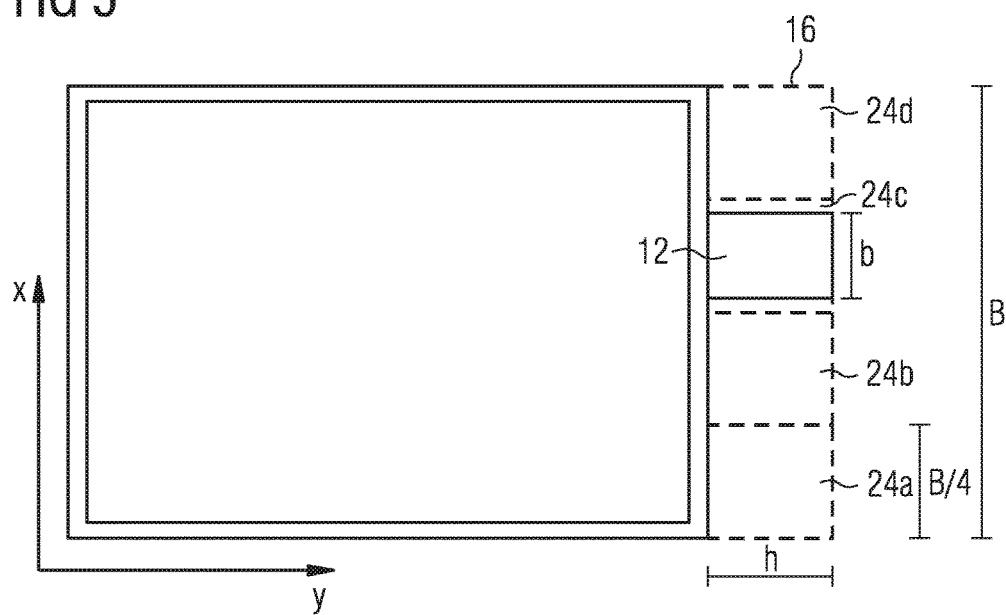
Figure 8:
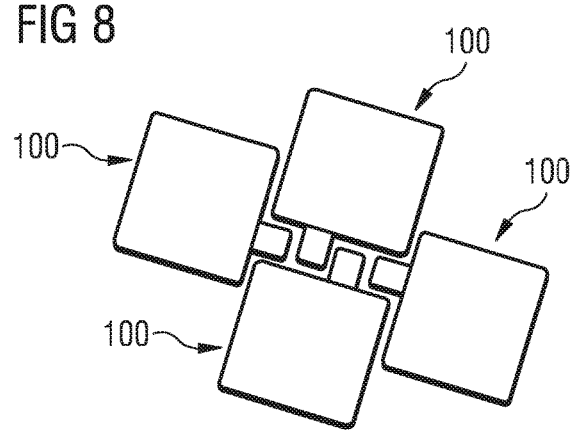
FIGS. 8 and 9 show an arrangement of four semiconductor chips in accordance with the second exemplary embodiment that are rotated by 90° relative to one another.
Figure 9:
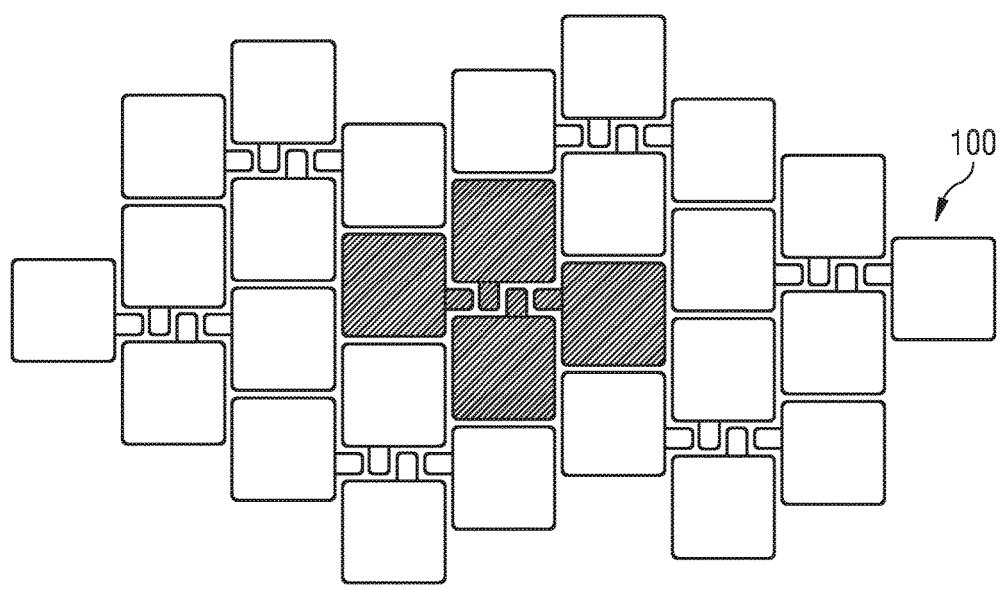

FIG. 8 shows the arrangement of four semiconductor chips in accordance with the second embodiment illustrated in FIGS. 4 and 5, said semiconductor chips being rotated by 90° relative to one another. In this case, the separating lines between the four contact regions 12, said separating lines corresponding to the separation pattern, have a substantially constant diameter. A group of four semiconductor chips arranged in this way forms a unit cell which can be continued periodically, as illustrated in FIG. 9. In this case, the unit cell is illustrated in the centre of the lattice.

Figure 10:
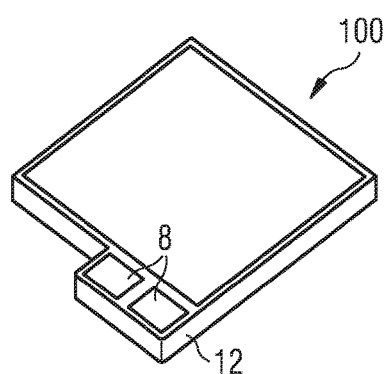
FIGS. 10 and 11 show a third exemplary embodiment of a semiconductor chip according to the invention.
Figure 11:
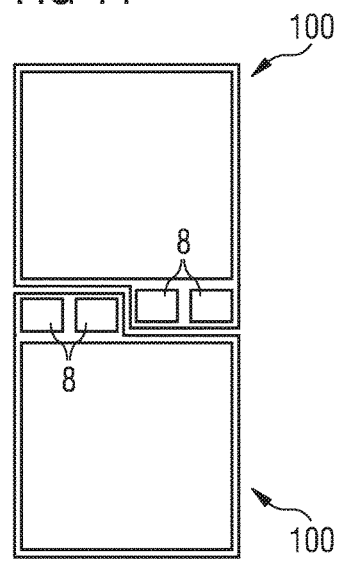

FIGS. 10 and 11 show a semiconductor chip 100 according to the invention in accordance with a third embodiment. In contrast to the semiconductor chips illustrated in FIGS. 1 to 9, two top side contacts 8 are arranged in the contact region 12, said top side contacts each being electrically connected to a semiconductor layer of the semiconductor body 2.

Figure 12:
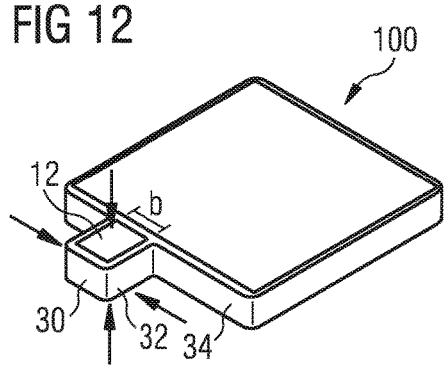
FIG. 12 shows an effect of mechanical forces on the contact region of a semiconductor chip in accordance with the second exemplary embodiment.

In FIG. 12, the effect of mechanical forces on the contact region 12 of a semiconductor chip 100 in accordance with the second embodiment is represented by arrows. By virtue of the fact that the contact region 12 has only a small width B, there is the risk that it will break off if a preferred breaking direction of the material of the carrier body 4 runs parallel to the side surfaces of the semiconductor chip 100. Therefore, it is expediently provided that the crystal forming the carrier body 4 is oriented in such a way that the side surfaces of the semiconductor chip 100 are formed completely or at least for the most part by crystal faces having a lower risk of fracture than other surfaces. By way of example, the carrier body 4 can consist of silicon or germanium which preferably breaks along a {100} plane (corresponding to the equivalent planes (100), (010) or (001)). In this case, it is provided that a plurality or all of the side surfaces of the semiconductor chip 100 run parallel to the {110} planes (corresponding to the equivalent planes (110), (011) or (101)) of the silicon or germanium crystal forming the carrier body 4. In FIG. 12, these are the side surfaces of the semiconductor chip 100 which are designated by 30, 32 and 34.

Figure 13:
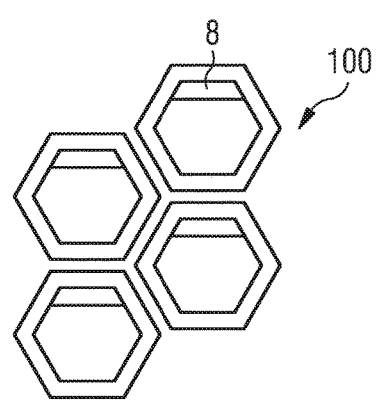
FIG. 13 shows a fourth exemplary embodiment of a semiconductor chip according to the invention.

FIG. 13 schematically shows a semiconductor chip 100 according to the invention in accordance with a fourth embodiment. In the case thereof, the semiconductor chip 100 has in projection the shape of a hexagon. An expedient ratio between cutting area and luminous area is achieved as a result.

Top side contacts 8 are provided at one side of the semiconductor chip 100. What is disadvantageous here is that the semiconductor body is embodied non-symmetrically and its positioning is more susceptible to faults.

The invention is not restricted by the description on the basis of the exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. A semiconductor chip having a semiconductor body, which comprises a semiconductor layer sequence, having a carrier body and having at least one top side contact, wherein:
    the semiconductor chip has in projection a shape that deviates from a rectangular shape,
    the semiconductor chip has a base region and a contact region, which is offset laterally from the base region, the at least one top side contact is arranged at least partly in the contact region, the base region has in projection the shape of a rectangle, and the contact region is adjacent to a side surface of the base region,
    the contact region is arranged in projection completely within a reference rectangle, one side of which is formed by a side of the projected base region and the height of which is equal to the maximum height of the projected contact region, and wherein the area of the contact region in projection is less than the area of the reference rectangle, and
    the contact region is arranged in projection at least with more than 80% of its area within a reference trapezoid arranged in the reference rectangle, wherein the height of the reference trapezoid is equal to that of the reference rectangle and the point of intersection of the diagonals of the reference rectangle is arranged outside the reference trapezoid.

2. The semiconductor chip according to claim 1, wherein the semiconductor body is embodied in a rectangular fashion.

3. The semiconductor chip according to claim 1, wherein the semiconductor chip is an optoelectronic component.

4. The semiconductor chip according to claim 1, wherein two top side contacts are arranged in the contact region.

5. The semiconductor chip according to claim 1, wherein the area of the contact region in projection is less than 75% of the area of the reference rectangle.

6. The semiconductor chip according to claim 1, wherein a width of the contact region in projection increases in a direction toward the base region.

7. The semiconductor chip according to claim 1, wherein a crystal which forms the carrier body is oriented in such a way that a plurality or all of the side surfaces of the carrier body are formed by crystal faces which have a low risk of fracture.

8. The semiconductor chip according to claim 7, wherein the carrier body consists of silicon or germanium and a plurality or all of the side surfaces of the carrier body are formed by {110} planes of the crystal forming it.

* * * * *